(12) United States Patent
Keech

(10) Patent No.: US 10,365,147 B2
(45) Date of Patent: Jul. 30, 2019

(54) METHOD AND APPARATUS FOR ELECTRODE IMPEDANCE MEASUREMENT

(71) Applicant: ABB Limited, Stonehouse, Gloucestershire (GB)

(72) Inventor: Ray Keech, Stonehouse (GB)

(73) Assignee: ABB Limited, Stonehouse, Gloucestershire (GB)

( * ) Notice: Subject to any disclaimer, the term of this patent is extended or adjusted under 35 U.S.C. 154(b) by 275 days.

(21) Appl. No.: 15/348,689

(22) Filed: Nov. 10, 2016

(65) Prior Publication Data

US 2017/0131131 A1    May 11, 2017

(30) Foreign Application Priority Data

Nov. 10, 2015  (GB) .................................. 1519835.1

(51) Int. Cl.
  *G01F 1/58*  (2006.01)
  *G01F 1/60*  (2006.01)
  (Continued)

(52) U.S. Cl.
  CPC .......... *G01F 25/0007* (2013.01); *G01F 1/584* (2013.01); *G01F 1/586* (2013.01);
  (Continued)

(58) Field of Classification Search
  CPC ...... G01F 25/0007; G01F 1/586; G01F 1/588; G01F 1/60
  See application file for complete search history.

(56) References Cited

U.S. PATENT DOCUMENTS

| | | | |
|---|---|---|---|
| 4,969,363 | A | 11/1990 | Mochizuki |
| 2003/0051557 | A1 | 3/2003 | Ishikawa et al. |
| 2010/0122582 | A1 | 5/2010 | Hencken et al. |

FOREIGN PATENT DOCUMENTS

| | | |
|---|---|---|
| EP | 0791806 A2 | 8/1997 |
| GB | 2333161 A | 7/1999 |

(Continued)

OTHER PUBLICATIONS

John P. Woodcock, "Theory and Practice of Blood Flow Measurement", Butterworth-Heinemann (2013).

(Continued)

*Primary Examiner* — Paul M. West
(74) *Attorney, Agent, or Firm* — Merchant & Gould P.C.

(57) ABSTRACT

A method measures electrical impedance of electromagnetic flowmeter sensing electrodes includes intermittently injecting an impedance measurement signal to at least one sensing electrode while a coil excitation drive signal is applied to flowmeter field generating coils. During a first interval, when the coil excitation drive signal is applied to the coils and the impedance measurement signal is injected to a sensing electrode, a first measurement signal is obtained. The first measurement signal includes an electromagnetically induced flow measurement signal and an electrode impedance measurement signal. During a second interval, when the coil excitation drive signal is applied to the coils but the impedance measurement signal is not injected to the sensing electrodes, a second measurement signal is obtained that includes an electromagnetically induced flow measurement signal. The first and second measurement signals combine into an output signal including the electrode impedance measurement signal without the electromagnetically induced flow measurement signal.

32 Claims, 6 Drawing Sheets

(51) Int. Cl.
*G01F 25/00* (2006.01)
*G01R 27/26* (2006.01)

(52) U.S. Cl.
CPC ................ *G01F 1/588* (2013.01); *G01F 1/60* (2013.01); *G01R 27/26* (2013.01)

(56) References Cited

FOREIGN PATENT DOCUMENTS

| | | |
|---|---|---|
| WO | 95/06857 A1 | 3/1995 |
| WO | 99/34174 A1 | 7/1999 |
| WO | 2011/144343 A1 | 11/2011 |

OTHER PUBLICATIONS

European Search Report for EP 16198808, dated Jan. 26, 2017.
UK Search Report for GB 1519835.1, dated May 25, 2016.

METHOD AND APPARATUS FOR ELECTRODE IMPEDANCE MEASUREMENT

This application claims benefit of GB 1519835.1, filed 10 Nov. 2015 in the United Kingdom which application is incorporated herein by reference. To the extent appropriate, a claim of priority is made to the above disclosed application.

FIELD OF THE INVENTION

This invention relates to electromagnetic flowmeters, and more particularly to a method and apparatus for measuring the electrode impedance of an electromagnetic flowmeter during use. For example, the method and apparatus may be used to perform in situ verification of flowmeter electrode integrity, or to determine the presence or absence of fluid within a conduit such as a pipe to which the flowmeter is coupled.

BACKGROUND TO THE INVENTION

In use, an electromagnetic (EM) flowmeter relies on at least two measuring electrodes in order to measure the fluid velocity within a conduit such as a pipe to which the flowmeter is coupled. These electrodes are normally in contact with the flowing fluid. If this contact is lost due to, say, low or no fluid level in the flow meter, then flow measurement is no longer possible. Possible coating of the electrodes, or low fluid conductivity, may also affect the flowmeter accuracy. Consequently, measurement of the impedance of the measuring electrodes, and thus verification of electrode integrity, can be of great benefit. Such information is an important diagnostic and alarm source for EM flowmeters.

It is well established, for example in GB 2333161, to measure resistance between electrodes by injecting a constant current and measuring the resulting voltage to calculate the individual electrode impedances of an EM flowmeter.

Injecting an electrical signal onto each measuring electrode results in a voltage being developed which is related to the impedance of that electrode to the measuring fluid. The induced voltage, which may be small, can have an amplitude lower than the small amplitude flow related signal induced by the flowing fluid as a result of electromagnetic induction. This flow induced signal is used to determine the fluid flow velocity, and it is important that any interference to the flow signal from signal injection used to measure impedance be kept to a minimum.

One technique, often employed to minimise interference, is to disable or interleave the flow velocity measurement whilst an electrode impedance measurement is being made. Whilst effective, this degrades the signal-to-noise ratio of the resulting flow measurement, and discontinuous operation means valuable flow measurement data may be lost or not obtained.

Another technique employed by modern low power EM flowmeters, such as those powered for example by batteries, is to minimise the duration for which the EM flowmeter is active over a given period of time. For instance, to reduce power consumption it is common practice to, say, take one flow measurement reading every 15 seconds. Minimising the duration of the flow measurements over a given period of time has benefits in reducing average power consumption and, if the flowmeter is battery powered, extending battery life. However, interleaving flow velocity measurements with electrode impedance measurements, as discussed above, would result in the overall measurement cycle being extended, thereby increasing the power consumption of the flowmeter and, if it is battery powered, decreasing the overall period for which it can operate before the batteries need to be replaced or recharged.

There is therefore a desire to improve the efficiency with which in situ electrode impedance measurements can be made in respect of an electromagnetic flowmeter during use.

There is also a desire to enable the impedance measurements to be made in a manner that does not cause significant interference or degradation to the desired flow signal and, more generally, does not result in appreciable measurement inaccuracies in the measured fluid velocity.

SUMMARY OF THE INVENTION

According to a first aspect of the present invention there is provided a method of obtaining a measure of electrical impedance in respect of one or more sensing electrodes of an electromagnetic flowmeter, the method comprising: intermittently injecting an impedance measurement signal to at least one of the sensing electrodes whilst a coil excitation drive signal is applied to field generating coils of the flowmeter; during a first interval; when the coil excitation drive signal is applied to the coils and the impedance measurement signal is injected to at least one of the sensing electrodes, obtaining a first measurement signal from the sensing electrodes, the first measurement signal comprising an electromagnetically induced flow measurement signal and an electrode impedance measurement signal; during a second interval, when the coil excitation drive signal is applied to the coils but the impedance measurement signal is not injected to at least one of the sensing electrodes, obtaining a second measurement signal from the sensing electrodes, the second measurement signal comprising an electromagnetically induced flow measurement signal; and combining the first measurement signal and the second measurement signal to obtain an output signal comprising the electrode impedance measurement signal without the electromagnetically induced flow measurement signal.

Thus the invention uses a form of "cancellation" to remove the unwanted field coil excitation induced component from the first interval measurement signal, to leave only the desired electrode impedance signal.

In such a manner, an in situ measure of electrode impedance can be obtained concurrently with subjecting the sensing electrodes to an alternating electromagnetic field for flow measurement purposes. By virtue of the concurrent nature of the impedance measurement signal and the flow measurement signal, there is no need to interleave flow velocity measurements with electrode impedance measurements, thereby avoiding the abovementioned disadvantages associated with interleaved measurements and enabling efficiency to be increased.

In certain embodiments the coil excitation drive signal has a recurring waveform and the intermittent impedance measurement signal is not injected during every recurrence of the coil excitation drive signal.

The coil excitation drive signal may have a cyclically varying waveform having a drive period.

In certain embodiments the cyclically varying waveform of the coil excitation drive signal may have symmetrically-alternating half cycles.

The combining may involve the use of a delay line having a delay period.

For example, the delay line may be implemented by means of a comb filter, the comb filter having the delay period. References herein to comb filters and the like should be interpreted broadly, to encompass any suitable arrangement in which a signal is combined with a delayed version of itself (e.g. using a subtractor or an adder), thereby resulting in one or more "notches" in the frequency domain, at which a corresponding frequency component will be rejected from the signal.

To reject the flow measurement signal and allow the electrode impedance measurement signal to pass, the comb filter delay period may be an integer number of full cycles of the electromagnetic excitation drive waveform, or an integer number of half cycles of the electromagnetic excitation drive waveform.

More particularly, with embodiments in which the excitation drive signal has a cyclically varying waveform, the delay period may be an integer number of cycles of the drive period of the coil excitation drive signal.

Alternatively, with embodiments in which the cyclically varying waveform of the excitation drive signal has symmetrically-alternating half cycles, the delay period may be an integer number of half cycles of the drive period of the coil excitation drive signal.

The coil excitation drive signal may have a form selected from a group comprising: a square wave, a pulsed form, a non 50:50 pulsed form, a sine wave, a triangular wave, a saw-tooth wave.

The impedance measurement signal may be injected to at least one of the sensing electrodes in a manner selected from a group comprising: constant current, constant voltage from a resistive source, voltage injection from a capacitive source.

Preferably the injection of the impedance measurement signal is synchronised with the coil excitation drive signal.

Preferably the impedance measurement signal comprises pulses of short duration, timed to occur just after polarity inversion of the coil excitation drive signal. In such a manner, by using the normally "wasted" time period just after polarity inversion of the excitation drive waveform in which the flow measurement value is unstable and inaccurate, the impedance measurement signals can be superimposed within the same timeframe as the flow measurement signals without any risk of interference between the impedance measurement signals and the "stable" part of the flow measurement signals.

For example, the impedance measurement signal (e.g. short pulses) may be timed to occur within only the first 75% of a half-cycle of the coil excitation drive signal.

More particularly, in certain embodiments, the impedance measurement signal may be timed to occur within only the first 50% of a half-cycle of the coil excitation drive signal.

In alternative embodiments, the impedance measurement signal may be timed to occur within only the first 25% of a half-cycle of the coil excitation drive signal.

More generally, for a pair of sensing electrodes, impedance measurement signals are preferably injected in a staggered manner, such that one electrode of the pair receives an impedance measurement signal after the other electrode of the pair.

This enables the impedance of each of the electrodes in the pair to be individually obtained.

The first interval and the second interval referred to above may be adjacent in time, such that one immediately follows from the other.

Alternatively, the first interval and the second interval may be spaced apart in time. That is to say, a time period may exist between the end of the first interval and the beginning of the second interval. This time period would preferably be an integer multiple of the field coil excitation half period.

The method may further comprise demodulating the electrode impedance measurement signal of the output signal to obtain a measure of electrical impedance in respect of at least one of the sensing electrodes.

The method may further comprise comparing the measure of electrode impedance to at least one threshold, and signalling at least one suspected fault condition in dependence on the results of the comparison. For example, the suspected fault condition may be signalled if the measure of impedance is above the threshold. For example, the electrode impedance may be used to detect a fluid-empty or part-full conduit (e.g. pipe).

In certain embodiments, measures of electrode impedance may be obtained in respect of a plurality of sensing electrodes located around a cross-section of a conduit, at positions between a low point of the cross-section and a high point of the cross-section, in order to determine the filling level of the conduit from the electrode impedance of each of the sensing electrodes.

More generally, the method may further comprise, in parallel with the combining of the first measurement signal and the second measurement signal to obtain the output signal comprising the electrode impedance measurement signal without the electromagnetically induced flow measurement signal: processing the first and/or second measurement signals to obtain a second output signal comprising the electromagnetically induced flow measurement signal without the electrode impedance measurement signal. In certain embodiments this may be done, for instance, by subjecting the first measurement signal to a comb filter operation. For example; with embodiments in which the cyclically varying waveform of the coil excitation drive signal has symmetrically-alternating half cycles; said comb filter operation may use a delay period corresponding to the half cycle period of the coil excitation drive signal.

According to a second aspect of the invention there is provided sensing apparatus configured to carry out a method in accordance with the first aspect of the invention.

Thus, sensing apparatus is provided for obtaining a measure of electrical impedance in respect of one or more sensing electrodes of an electromagnetic flowmeter, the sensing apparatus comprising: one or more signal generators configured to intermittently inject an impedance measurement signal to at least one of the sensing electrodes whilst a coil excitation drive signal is applied to field generating coils of the flowmeter; obtaining means for obtaining a first measurement signal from the sensing electrodes during a first interval when the coil excitation drive signal is applied to the coils and the impedance measurement signal is injected to at least one of the sensing electrodes; the first measurement signal comprising an electromagnetically induced flow measurement signal and an electrode impedance measurement signal; obtaining means for obtaining a second measurement signal from the sensing electrodes during a second interval when the coil excitation drive signal is applied to the coils but the impedance measurement signal is not injected to at least one of the sensing electrodes, the second measurement signal comprising an electromagnetically induced flow measurement signal; and combining means for combining the first measurement signal and the second measurement signal to obtain an output signal comprising the electrode impedance measurement signal without the electromagnetically induced flow measurement signal.

Such sensing apparatus may be incorporated within an electromagnetic flowmeter, or provided as a separate unit or module for connection to a pre-existing electromagnetic flowmeter.

Thus, according to a third aspect of the invention there is provided an electromagnetic flowmeter comprising field generating coils, an excitation current generator for supplying said coils with a coil excitation drive signal, one or more pairs of sensing electrodes, and sensing apparatus in accordance with the second aspect of the invention.

The excitation current generator may be configured to supply said coils with a coil excitation drive signal having a form selected from a group comprising: a square wave, a pulsed form, a non 50:50 pulsed form, a sine wave, a triangular wave, a saw-tooth wave.

The electromagnetic flowmeter may further comprise means for producing an output signifying zero flow on detection of an impedance signifying an empty conduit (e.g. pipe).

Alternatively, or in addition, the electromagnetic flowmeter may further comprise means for producing an output signifying that a conduit (e.g. pipe) through which flow is being measured is empty or partially empty.

The output from the sensing electrodes over a number of intervals, comprising the electromagnetically induced flow measurement signal (present in the abovementioned first and second intervals, and potentially continuously), together with intermittent electrode impedance measurement signals at discrete times (e.g. during the first interval), may be referred to herein as a "composite signal".

Thus, in accordance with a fourth aspect of the invention there is provided a method of obtaining a measure of electrical impedance in respect of one or more sensing electrodes of an electromagnetic flowmeter, the method comprising: injecting intermittent impedance measurement pulses to at least one of the sensing electrodes whilst subjecting the sensing electrodes to a cyclically varying electromagnetic field, thereby causing the sensing electrodes to produce a composite signal comprising electromagnetically induced flow measurement signals and electrode impedance measurement signals; and subjecting the composite signal to a filter operation in which the composite signal is combined with a delayed portion of itself, the delay period being such as to cancel the electromagnetically induced flow measurement signals from the composite signal, thereby enabling the electrode impedance measurement signals to be extracted and used to obtain a measure of electrode impedance.

In parallel, the composite signal may also be filtered to remove the electrode impedance measurement signals and to obtain the electromagnetically induced flow measurement signals Similarly, according to a fifth aspect of the invention there is provided sensing apparatus for obtaining a measure of electrical impedance in respect of one or more sensing electrodes of an electromagnetic flowmeter, the sensing apparatus comprising: one or more signal generators configured to intermittently inject impedance measurement pulses to at least one of the sensing electrodes whilst the sensing electrodes are subjected to a cyclically varying electromagnetic field, thereby causing the sensing electrodes to produce a composite signal comprising electromagnetically induced flow measurement signals and electrode impedance measurement signals; and filter circuitry configured to combine the composite signal with a delayed portion of itself, the delay period being such as to cancel the electromagnetically induced flow measurement signals from the composite signal, thereby enabling the electrode impedance measurement signals to be extracted and used to obtain a measure of electrode impedance.

An electromagnetic flowmeter may comprise one or more pairs of sensing electrodes, and sensing apparatus in accordance with the fifth aspect of the invention.

BRIEF DESCRIPTION OF THE DRAWINGS

Embodiments of the invention will now be described, by way of example only, and with reference to the drawings in which:

as illustrated in FIG. 1) and associated filter circuitry (e.g. as illustrated in FIGS. 2, 4 and 7).

In the figures, like elements are indicated by like reference numerals throughout.

DETAILED DESCRIPTION OF PREFERRED EMBODIMENTS

Figure 1:
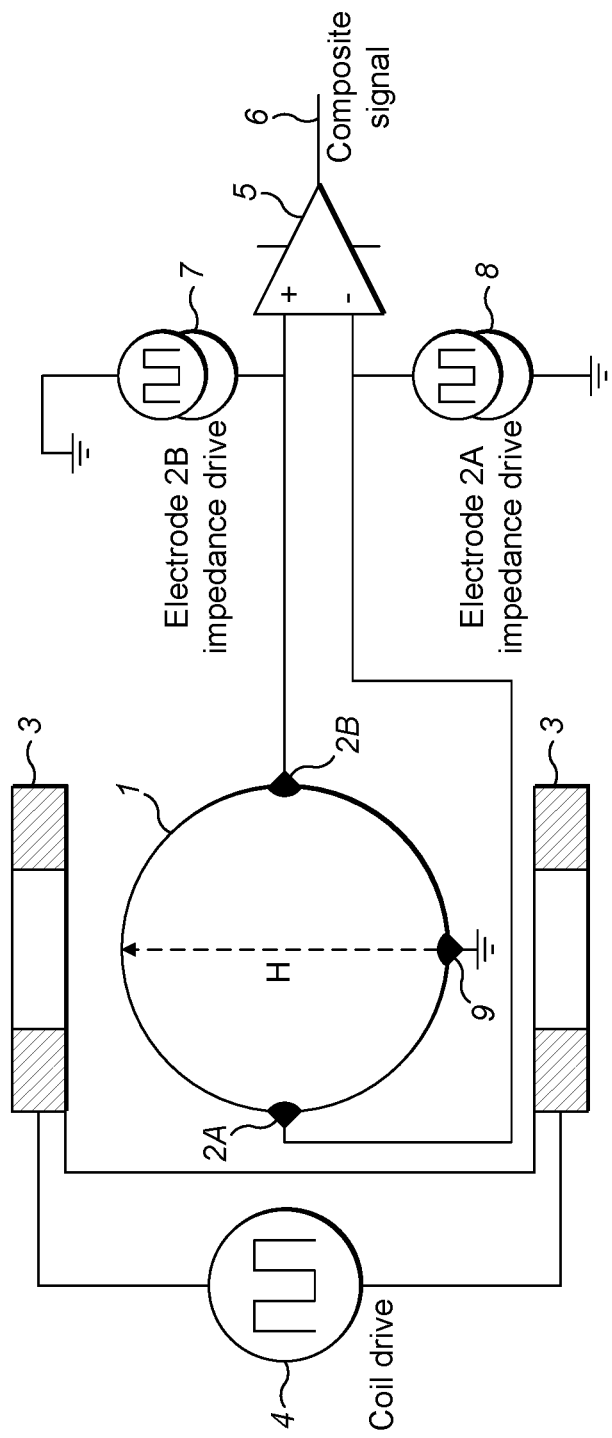
FIG. 1 is a schematic illustration of an EM flowmeter incorporating means for measuring electrode impedance, operable to produce a composite signal comprising an EM flow signal and electrode impedance measurement signals.

The present embodiments represent the best ways known to the applicants of putting the invention into practice. However, they are not the only ways in which this can be achieved.

Overview

The present embodiments provide a method and apparatus for obtaining a measure of electrical impedance in respect of one or more sensing electrodes of an electromagnetic flowmeter. This is achieved by intermittently injecting an impedance measurement signal to at least one of the sensing electrodes whilst an excitation drive signal is applied to the field generating coils of the flowmeter. During a first interval, when the excitation drive signal is applied to the coils and the impedance measurement signal is injected to at least one of the sensing electrodes, a first measurement signal is obtained from the sensing electrodes, the first measurement signal comprising an electromagnetically induced flow measurement signal and an electrode impedance measurement signal. During a second interval, when the excitation drive signal is applied to the coils but the impedance measurement signal is not injected to at least one of the sensing electrodes, a second measurement signal is obtained from the sensing electrodes, the second measurement signal comprising an electromagnetically induced flow measurement signal. The first measurement signal and the second measurement signal are then combined (e.g. subtracted, for example using a comb filter) to obtain an output signal comprising the electrode impedance measurement signal without the electromagnetically induced flow measurement signal.

During typical use of the flowmeter, numerous occurrences of the first and second intervals occur.

As mentioned above, the output from the sensing electrodes over a number of intervals, comprising the electromagnetically induced flow measurement signal (present in the first and second intervals, and potentially continuously), together with intermittent electrode impedance measurement signals at discrete times (e.g. during the first interval), may be referred to herein as a "composite signal".

In presently preferred embodiments the EM flow measurement signals and the electrode impedance measurement signals are superimposed within the composite signal in the same timeframe (within the first interval) without interference by using the normally "wasted" time period just after each polarity inversion of the excitation coil current in which flow measurement is not possible (due to the coil current through the excitation coil's inductance, and associated eddy currents in the EM flowmeter having not yet stabilised). That is to say, the generation of the electrode impedance measurement signals is timed to coincide with the abovementioned normally "wasted" portion of the excitation cycle of the flow measurement coils.

As discussed in greater detail below, typically the impedance measurement signals are at relatively high frequency in comparison to the excitation frequency of the flow measurement coils, thereby enabling the impedance measurement signals to be accommodated within this normally "wasted" portion of the coil excitation cycle.

Using the present method and apparatus, simultaneous measurements of flow velocity and electrode impedance can be obtained, by extracting from the composite signal, in parallel, the electromagnetically induced flow measurement signal and the electrode impedance measurement signals. Such simultaneous measurements reduce the flowmeter's total power consumption, which for battery-powered meters extends the battery life (or recharging period).

The present method and apparatus may be employed to provide an EM flowmeter with an "empty pipe detector", which may be used to ensure the flowrate output is controlled, usually to zero flow under an empty or partially-full pipe condition.

Signal Generation and Processing Principles

With an EM flowmeter the designer has control of both the sensor coil's magnetic excitation frequency and the electrode impedance measurement waveforms/frequency. The magnetic excitation is limited in frequency due to the coil inductance and eddy current generated in the flowmeter sensor magnetic circuit. Such eddy currents oppose the applied magnetic field and slowly decay, depending on the materials and the design of the EM sensor. As a consequence the EM drive if often limited to say 30 Hz, or possibly as low 5 Hz for large diameter EM sensors. The electrical impedance measurement drive has no such restriction and can often operate at say 100 Hz.

The electrochemical interface that exists between the measuring electrodes and the fluid is complex in nature, with a significant capacitive component due to surface charge. The excess charges in the fluid and electrode form a so-called double layer. Disturbance of these surface charges by any applied impedance measurement causes unwanted residual voltages on the measuring electrodes, which can readily interfere with the accuracy of the flow velocity measurement. For such reasons, the applied impedance measurement drive is kept very low, resulting in very small (e.g. a few nV) impedance signals.

According to presently-preferred embodiments, a high frequency electrode drive signal is applied to the measurement electrodes at, or just after, the point in time in the coil excitation cycle when the lower frequency coil current is changed or its polarity is inverted. This period is unusable for flow velocity determination due to the aforementioned instability in the EM sensor's magnetic field. However, resolving small electrode impedance measurement signals in the presence of relatively high amplitude electromagnetic flow signals is difficult. For instance most physical sensors also have an unwanted transformer action, where such changing magnetic H field creates a signal corresponding to the derivative of the changing field. This further compounds the ability to resolve any such small electrode impedance measurement signals.

Consequently, in presently-preferred embodiments, a cancellation technique is used whereby the electrode impedance drive signal is not applied on every coil excitation cycle. This enables the sensed electrode signal, obtained during a cycle when the electrical impedance drive signal is applied, to be stored and subtracted from (or otherwise compared to) the sensed electrode signal obtained during a cycle when the electrical impedance drive signal is not applied. The coil excitation cycle during which the electrical impedance drive signal is applied may be considered to be the first interval as mentioned above, whilst the coil excitation cycle during which the electrical impedance drive signal is not applied may be considered to be the second interval. As the coil drive signal and associated electrode voltage is deterministic and repeatable, subtraction (or other comparison) of the stored waveform from that obtained when the electrical impedance drive signal is not applied removes unwanted signal corruptions resulting from the electromagnetic flow signal, allowing simple and accurate recovery of the electrode impedance measurement signal.

Although, in this example, the sensed electrode signal that is stored is the one obtained when the electrical impedance drive signal is applied during the coil excitation cycle, and this stored signal is subtracted from the sensed electrode signal obtained when the electrical impedance drive signal is not applied, alternatives configurations are possible.

For example, in an alternative embodiment, the sensed electrode signal that is stored may be the one obtained when the electrical impedance drive signal is not applied during the coil excitation cycle, and this stored signal may be subtracted from the sensed electrode signal obtained when the electrical impedance drive signal is applied.

In the examples given in the above two paragraphs, the stored signal is subtracted from the signal that is not stored. However, in variants of the examples described in the above two paragraphs, the signal that is not stored may be subtracted from the signal that is stored, to give essentially the same outcome (but with a change in sign), as those skilled in the art will appreciate.

In presently-preferred embodiments the sensed electrode signal that is stored is stored by means of a delay line. More particularly, in presently-preferred embodiments the delay line is implemented by means of a comb filter configured to remove the electromagnetic flow signal and to output the impedance measurement signals without corruption from the flow signal. Different configurations of such a comb filter are possible, as discussed in more detail below.

As the electrode impedance measurement is a secondary measurement, i.e. not the main primary flow measurement, it may be beneficial to only apply an impedance measurement cycle from say once a second to say once every 15 seconds. For example, for a battery powered flowmeter, with a reading rate of every 15 seconds, this would typically incorporate an impedance measurement of both measurement electrodes every 15 seconds. Where a higher energy source is available, say solar power, then one impedance measurement every 2 seconds would be more typical, which could correspond to say every 10th coil drive cycle.

The time interval between the start of the first interval and the start of the second interval, for say a coil drive excitation frequency of 12.5 Hz, may be as little as 80 ms (e.g. for the arrangement in FIG. 4, discussed below) or 40 ms (e.g. for the arrangement in FIG. 7, discussed below), if the first interval and the second interval are immediately adjacent to one another in time. Alternatively, there may be a time period between the end of the first interval and the start of the second interval.

Figure 4:
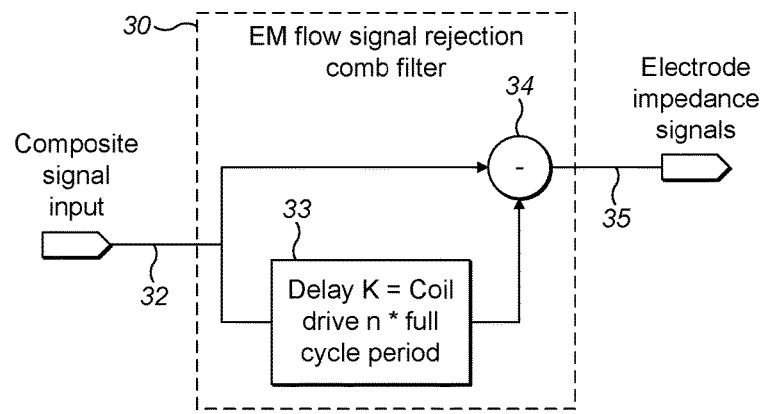
FIG. 4 is a block diagram illustrating a second signal processing configuration to reject the EM flow signal by means of a first "flow signal rejection" comb filter arrangement, and thereby extract the electrode impedance measurement signals from a composite input signal.
Figure 7:
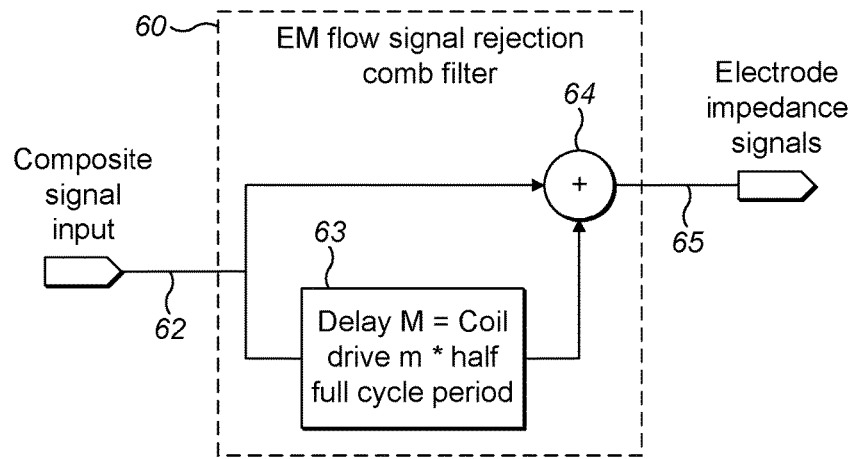
FIG. 7 is a block diagram illustrating a third signal processing configuration to reject the EM flow signal by means of a second "flow signal rejection" comb filter arrangement, and thereby extract the electrode impedance measurement signals from a composite signal.

The delay line may store the delayed input signal up to the value of the delay line—for example for the value of K for the configuration in FIG. 4, or the value of M for the configuration in FIG. 7.

Flowmeter Configuration and Operation

Referring to FIG. 1, an insulating pipe 1 contains flowing fluid and has positioned around it a pair of coils 3 wired in series. A periodic square wave constant current generator 4 connected to the two coils 3 generates an alternating magnetic field H across the pipe 1. The direction of the field reverses each time the polarity of the excitation 4 changes. The movement of the fluid through the magnetic field generates a voltage between sensing electrodes 2A and 2B, the polarity of which also changes with that of the coil excitation signal. The differential amplifier 5 with output 6 contains a square wave component, whose amplitude corresponds to the fluid flow velocity in pipe 1.

FIG. 1 also includes two constant current generators 7 and 8 configured to inject a small current into each of the sensor electrodes 2A and 2B. A voltage is developed, which is amplified by 5. The composite output signal 6 is thus a superposition of the signal due to flow velocity from the magnetic field H and the electrical impedance of each electrode 2A and 2B. The timing of the generators 7 and 8 is preferably staggered in respect of each electrode impedance to be determined. That is to say, the electrode impedance measurement signal generated by generator 7 and sent to electrode 2B would be sent at a different time from the electrode impedance measurement signal generated by generator 8 and sent to electrode 2A. This enables the impedance of each electrode to be independently measured.

In some flowmeters an extra "ground" or fluid contact electrode 9 is present, which is the return path for the excitation generators 7 & 8. If such an electrode is not present, ground rings are normally provided at the meter flange, or the meter is grounded to the upstream/downstream pipework.

In alternative embodiments the constant current generators 7 & 8 may be replaced by a voltage generator with a known source resistance, or a voltage generator with a coupling capacitor of known source impedance.

In other alternative embodiments the constant current generators 7 & 8 may be replaced by an alternative current injection means to create a defined injection signal whereby the impedance of the electrode circuit can be determined by the applied signal.

The composite output signal 6 may then be filtered in a parallel manner to simultaneously extract the EM induced flow signal and the electrode impedance measurement signal. The configuration and operation of some suitable filters, for use in a parallel filtering arrangement (e.g. as identified by 82 and 83 in FIG. 10, which is discussed in greater detail below) will now be described.

Filter for Extracting EM Induced Flow Signal

Figure 2:
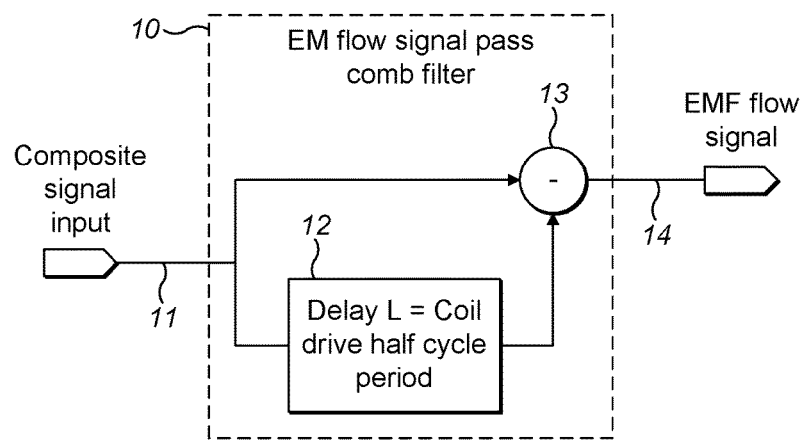
FIG. 2 is a block diagram illustrating a first signal processing configuration for extracting the EM flow signal from a composite input signal by means of a "flow signal pass" comb filter arrangement.

FIG. 2 illustrates a first signal processing configuration for extracting an EM induced flow signal from a composite input signal 11 (the composite input signal 11 corresponding to the composite output signal 6 of FIG. 1). This involves the use of a comb filter arrangement 10 operating in a "flow signal pass" manner, in which the comb filter output equals a delayed version of the input signal subtracted from the input signal, as defined mathematically by the equation:

$$y(n)=x(n)-x(n-L)$$

where:
y(n)=output
x(n)=input
L=delay

The comb filter delay value L (12 in FIG. 2) is set to the coil drive half period as given by $$L=1/(2\times EM \text{ coil excitation frequency})$$

A subtractor 13 implements the comb filter operation, thereby producing output 14.

Figure 3:
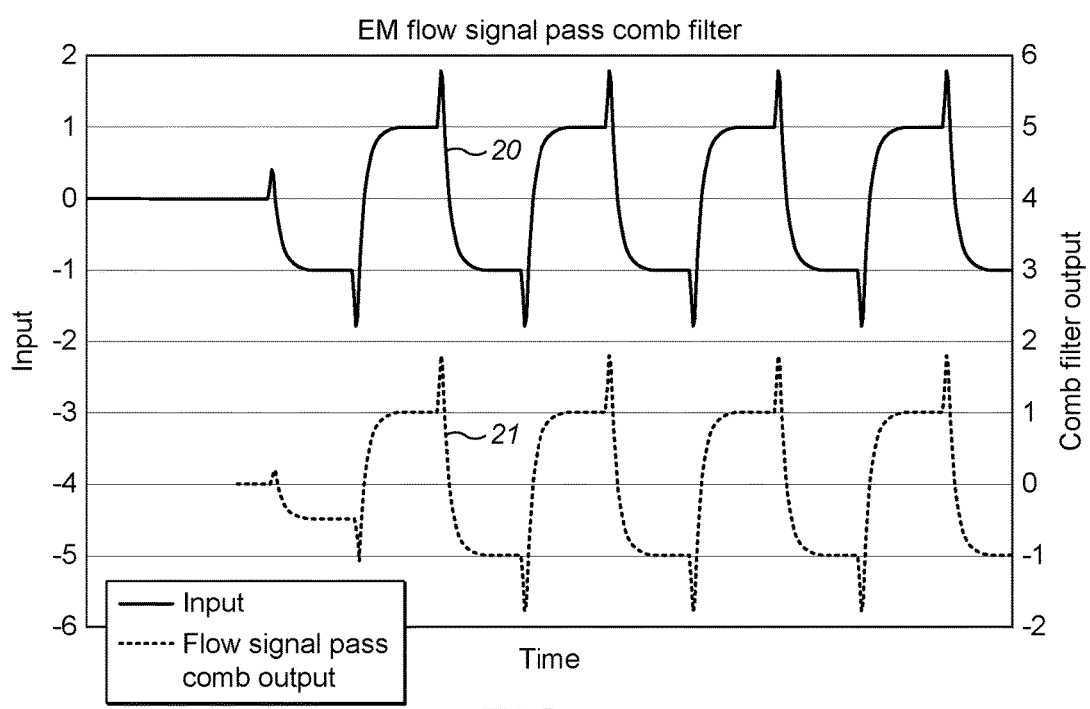
FIG. 3 illustrates operation of the first signal processing configuration to extract the EM flow signal from a composite input signal.

FIG. 3 illustrates the extraction of an EM flow signal 21 from a composite input signal 20 using the signal processing arrangement of FIG. 2 (with composite input signal 20 in FIG. 3 corresponding to signal 11 in FIG. 2, and the extracted EM flow signal 21 in FIG. 3 corresponding to output signal 14 in FIG. 2).

Whilst FIGS. 2 and 3 illustrate one possible technique to extract the EM induced flow signal from the composite signal, other suitable techniques may be used instead.

Using techniques well-known to those skilled in the art of electromagnetic flowmeters, the EM induced flow signal extracted from the composite signal can then be demodulated to obtain a measure of the flow velocity of the fluid. As discussed below, this can be done in parallel with obtaining a measure of the electrode impedance of one or more sensing electrodes, by extracting the electrode impedance measurement signal from the same composite signal.

Filter for Extracting Electrode Impedance Measurement Signal

The present work contemplates two alternative signal processing configurations for extracting an electrode impedance measurement signal from a composite input signal. In each of these two alternatives, a comb filter is operated in a "flow signal rejection" manner, thereby enabling the electrode impedance measurement signal to be extracted. Either such alternative may be disposed in parallel with a "flow signal pass" filter as described above.

First Alternative of Filter for Extracting Electrode Impedance Measurement Signal FIG. 4 illustrates a first alternative of a "flow signal rejection" signal processing configuration, whereby a comb filter arrangement 30 is used to extract an electrode impedance measurement signal from a composite input signal 32 (the composite input signal 32 corresponding to the composite output signal 6 of FIG. 1). Here the comb filter is defined by:

$$y(n)=x(n)-x(n-K)$$

where:
y(n)=output
x(n)=input
K=delay

This rejects the EM flow related signal generated by the repetitive electromagnetic flow signal, and thereby extracts the electrode impedance measurement signal. For the comb filter delay 33, the delay value K is set to an integer multiple of the coil drive period such that:

$$K=n \times (1/\text{EM coil excitation frequency})$$

where n=integer.

When the delayed version of the input signal is subtracted from the input signal by subtractor 34, the resulting output 35 removes the electromagnetic (EM) induction signal. This removed EM induced signal will consist of all component parts, such as: the induced electromagnetic flow signal corresponding to the flow velocity through the pipe 1; the transformer action associated with a derivative term due to the changing current in coils 3; the slow rise time inductance effects associated with changing the coil current 3 and the eddy currents which exist in the sensor magnetic circuits. For this cancellation to work an assumption is made that the flow velocity is constant. For situations where the flow velocity is unstable or rapidly changing, such cancellation may not be perfect.

Figure 5:
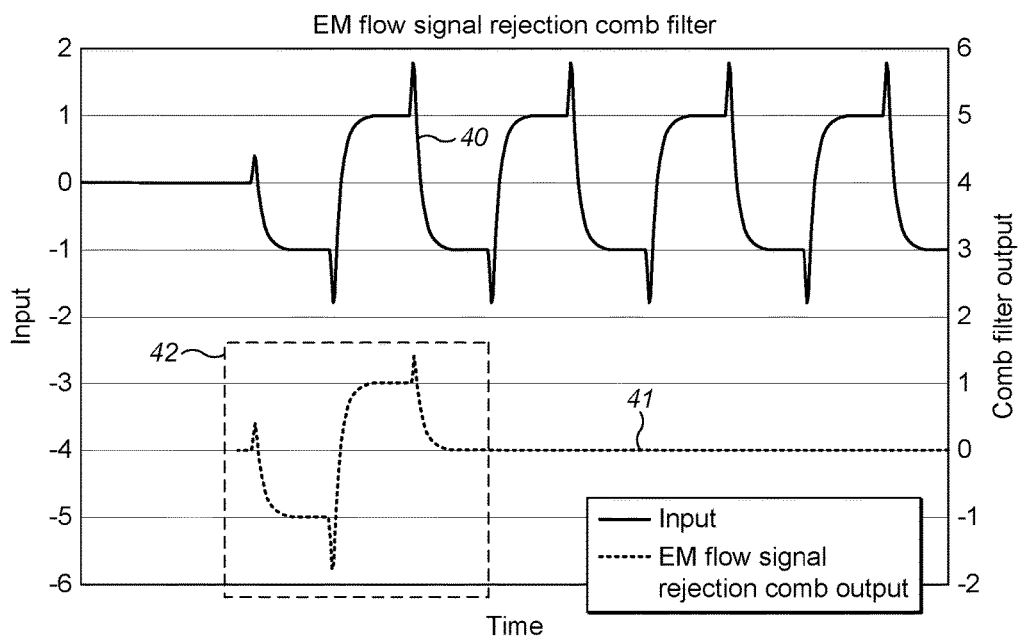
FIG. 5 illustrates operation of the second signal processing configuration, showing rejection of the EM flow signal with no electrode impedance injection.

FIG. 5 illustrates the operation of the filter arrangement of FIG. 4, without the application of any impedance measurement signals. Consequently, the output signal 41 from the comb filter 30 shows complete rejection of the electromagnetic flow signals (for steady state flow velocity) from the input signal 40. During coil excitation start up, the comb filter 30 does not have its delay line 33 populated with the necessary historic information, so initial cancellation in area 42 is not effective, but from there on the removal of the electromagnetic flow signals, together with the absence of any impedance measurement signals, results in a null output signal 41.

Timing of Electrode Impedance Measurement Signals and Extraction Thereof

In one embodiment, the electrode impedance signal generators 7 and 8 are configured to provide an electrode impedance measurement signal in the form of a short higher frequency square wave burst. Moreover, generators 7 and 8 are controlled so as to time the generation of the electrode impedance measurement signals so as to be just after the coil excitation polarity is changed or reversed—thereby coinciding with the otherwise "wasted" portion of the excitation cycle of the flow measurement coils, as mentioned above.

For example, the impedance measurement injection may be timed to occur within only the first 75% of the half-cycle of the electromagnetic excitation drive waveform. More particularly, the impedance measurement injection may be timed to occur within only the first 50% of the half-cycle of the electromagnetic excitation drive waveform (or alternatively within only the first 70%, or 65%, or 60%, or 55% of the half-cycle of the electromagnetic excitation drive waveform). In alternative embodiments, the impedance measurement pulses may be timed to occur within only the first 25% of the half-cycle of the electromagnetic excitation drive waveform (or alternatively within only the first 45%, or 40%, or 35%, or 30% of the half-cycle of the electromagnetic excitation drive waveform).

Figure 6:
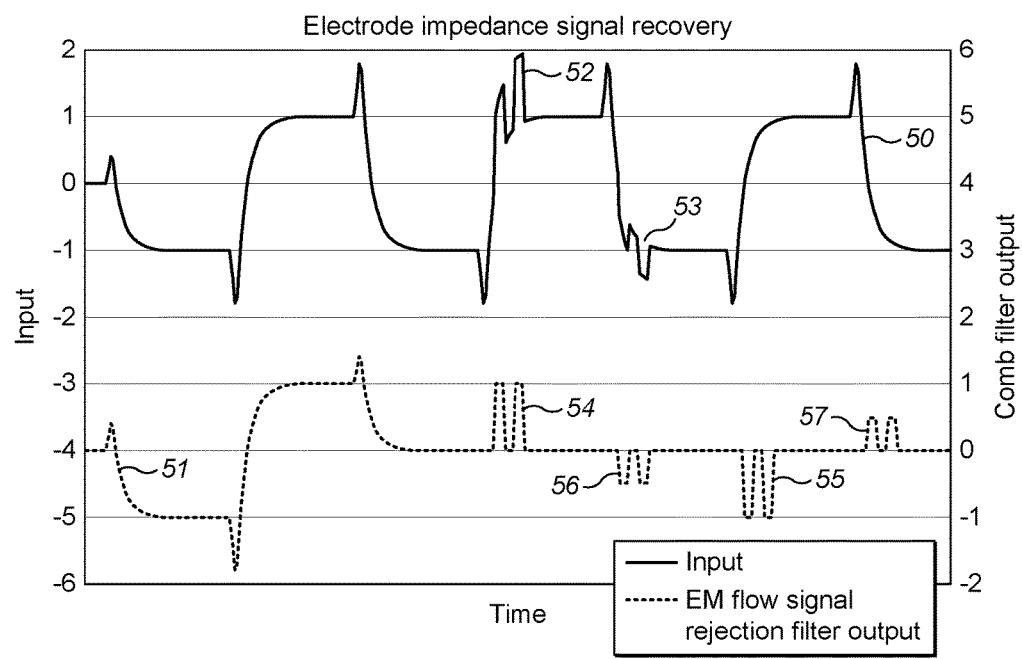
FIG. 6 illustrates recovery of the electrode impedance measurement signals in the presence of a large EM flow signal, using the second signal processing configuration.

For the purposes of the illustration in FIG. 6, an impedance on electrode 2A is half that of electrode 2B. The input signal 50 (corresponding to the composite output signal 6 of FIG. 1, and input signal 32 of FIG. 4) supplied to the comb filter 30 shows a superposition of the EM flow signal plus the result of the two electrode excitation signals, with superposed signal 52 being from the impedance at electrode 2B (due to generator 7), and superposed signal 53 being from the impedance at electrode 2A (due to generator 8). As will be appreciated from FIG. 6, measuring the amplitude of signals 52 and 53 within the raw composite signal 50, to determine the electrical impedance of electrodes 2A and 2B, would conventionally be extremely difficult. Techniques such as high pass or band pass filtering of the signal 50 are well known, but not very effective in the presence of such corrupting EM-induced signals.

However, the abovementioned "flow signal rejection" signal processing configuration, as shown in FIG. 4, provides effective means for rejecting the EM flow signal and enabling the electrode impedance measurement signals to be extracted. This is illustrated in FIG. 6, in which signal 51 is the output signal from the comb filter 30 (the comb filter 30 having filtered the input signal 50). It can be seen that the impedance measurement signal from electrode 2B is present twice at times 54 and then inverted at 55, which is the nature of such comb filter processing. Similarly, the impedance measurement signal from electrode 2A is present twice at times 56 and then inverted at 57. It can also be observed that the electrode impedance measurement signals are of the exact shape of the short higher frequency square wave burst excitations produced by generators 7 & 8; the unwanted EM induced components have been completely removed. The amplitude of these recovered signals 54 & 55, 56 & 57 can then be easily determined to give an accurate determination of the electrode impedances for electrodes 2B and 2A respectively. Suitable techniques for demodulating these short electrode-impedance square wave bursts to determine their amplitude are straightforward and well-known to those skilled in the art, and therefore need not be described in detail herein.

For the EM flow signal rejection comb filter 30 to operate, the pulses produced by the electrode impedance signal generators 7 and/or 8 should be intermittent, and not occur on every cycle at the same time—otherwise the EM flow signal rejection comb filter 30 will also remove the impedance signal measurement signal from the composite signal.

In a further embodiment the timing of the electrode impedance signal generators 7 and/or 8 can be staggered and moved to occur at different times within the EM flow signal excitation cycle 4.

Second Alternative of Filter for Extracting Electrode Impedance Measurement

FIG. 7 illustrates a variant of the signal processing configuration of FIG. 4, again being a "flow signal rejection" configuration. With the alternative of FIG. 7, the EM flow signal is rejected by means of comb filter arrangement 60, thereby enabling the electrode impedance measurement signals to be extracted from the composite signal. With the alternative of FIG. 7, an assumption is made that the coil excitation is symmetric between positive and negative half cycles of the EM drive from generator 4; this enables cancellation of the EM flow signal from the previous half cycle (rather than as per the alternative of FIG. 4 where the complete cycle is used). Thus, FIG. 7 illustrates an embodiment based on this half cycle processing. This uses a variation of a feedforward comb filter using an adder 64, as defined by the equation:

$$y(n)=x(n)+x(n-M)$$

where:
- y(n)=output
- x(n)=input
- M=delay

In this second alternative the comb filter 60 has a delay 63, to reject unwanted EM flow interference from the repetitive electromagnetic flow signal by means of adder 64 summing the previous half cycle produced by the coil drive excitation generator 4. For the comb filter delay 63, the delay value M is set to an integer multiple of the coil drive half period such that:

$$M=m\times 1/(2\times \text{EM coil excitation frequency})$$

where m=integer.

Figure 8:
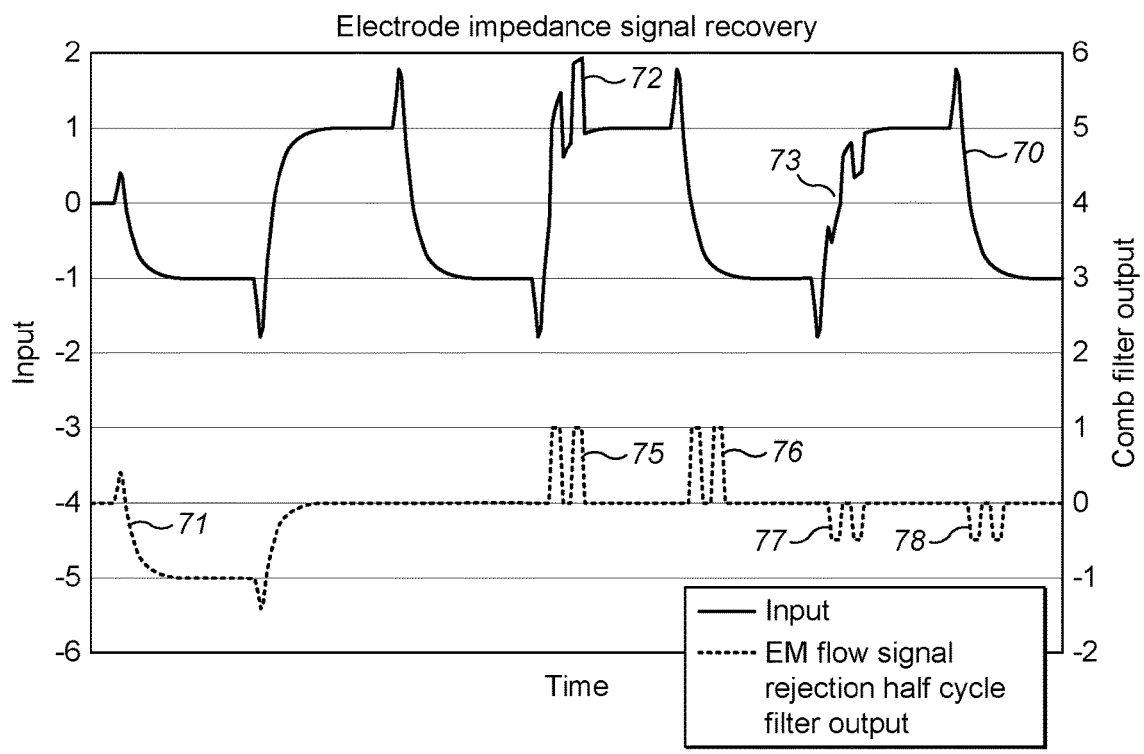
FIG. 8 illustrates operation of the third signal processing configuration, showing rejection of the EM flow signal.

Operation of this second alternative is illustrated in FIG. 8. Here the input signal 70 (corresponding to the composite output signal 6 of FIG. 1, and input signal 62 of FIG. 7) supplied to the comb filter 60 includes electrode impedance measurement signals (superimposed as shown at 72 & 73) resulting from the operation of generators 7 & 8. The comb filter 60 produces output signal 71, with the corresponding recovered electrode impedance measurement signals illustrated at 75 & 76, and at 77 & 78. The duplication of the pulses (as illustrated at 75 & 76, and at 77 & 78) is an expected function of such a comb filter arrangement. As mentioned above in relation to the first alternative, recovery of the amplitude of these electrode impedance measurement signals is straightforward, enabling the respective impedances of electrodes 2B and 2A to be determined.

Pipe Content Depth Determination

Figure 9:
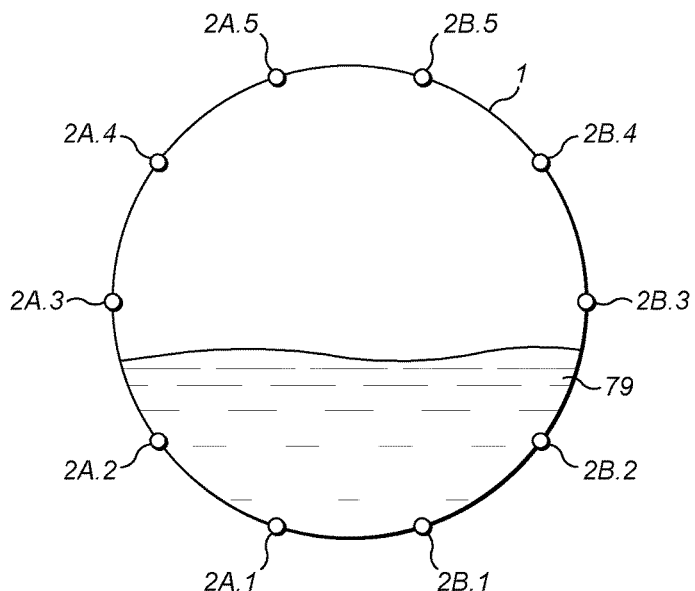
FIG. 9 illustrates a cross-section of a pipe having a plurality of pairs of sensor electrodes at a range of vertical positions around the cross-section, in order to enable the filling level of the pipe to be determined from the electrode impedance of each of the pairs of electrodes.

Electrical impedance measurements obtained by either of the above alternatives can be used to determine an empty pipe condition or a partly full pipe condition. In this regard, as illustrated in FIG. 9, it is possible to add further pairs of sensing electrodes around a cross-section of the pipe 1, at a range of vertical positions between a low point of the cross-section and a high point of the cross-section, and to use the present principles to measure the fluid impedance at each pair of electrodes (i.e. at each of the vertical positions within the cross-section), and thence calculate the filling level of the pipe being measured. In the example shown in FIG. 9, five pairs of sensing electrodes are provided, with electrode pair 2A.1 & 2B.1 being at a low point of the cross-section, electrode pair 2A.2 & 2B.2 being approximately quarter of the way up, electrode pair 2A.3 & 2B.3 being half way up, electrode pair 2A.4 & 2B.4 being approximately three quarters of the way up, and electrode pair 2A.5 & 2B.5 being at a high point of the cross-section. A "ground" electrode (9 of FIG. 1) has been omitted from this illustration for the sake of simplicity, but may be included.

The presence or absence of fluid 79 between each electrode pair is reflected by the respective impedance measurements provided by each electrode pair. In the example illustrated, electrode pairs 2A.1 & 2B.1 and 2A.2 & 2B.2 will both provide impedance measurements indicative of the presence of fluid 79 between the respective electrodes, whereas electrode pairs 2A.3 & 2B.3, 2A.4 & 2B.4 and 2A.5 & 2B.5 will each provide impedance measurements indicative of the absence of fluid between the respective electrodes. From such measurements it can readily be determined that the fluid level is at least as high as electrode pair 2A.2 & 2B.2 but not as high as electrode pair 2A.3 & 2B.3.

It should be noted that the further electrodes only need to be in pairs if they are also to provide a flow measurement function. To just obtain impedance values (and thus depth determination) single electrodes could be used as the further electrodes and the present technique would still work.

Indeed, more advanced tomographic techniques can be used to combine and utilise the measured impedance data from each electrode (potentially single electrodes, rather than in pairs) to give a more accurate determination of the pipe filling level.

Flowmeter Circuit

Figure 10:
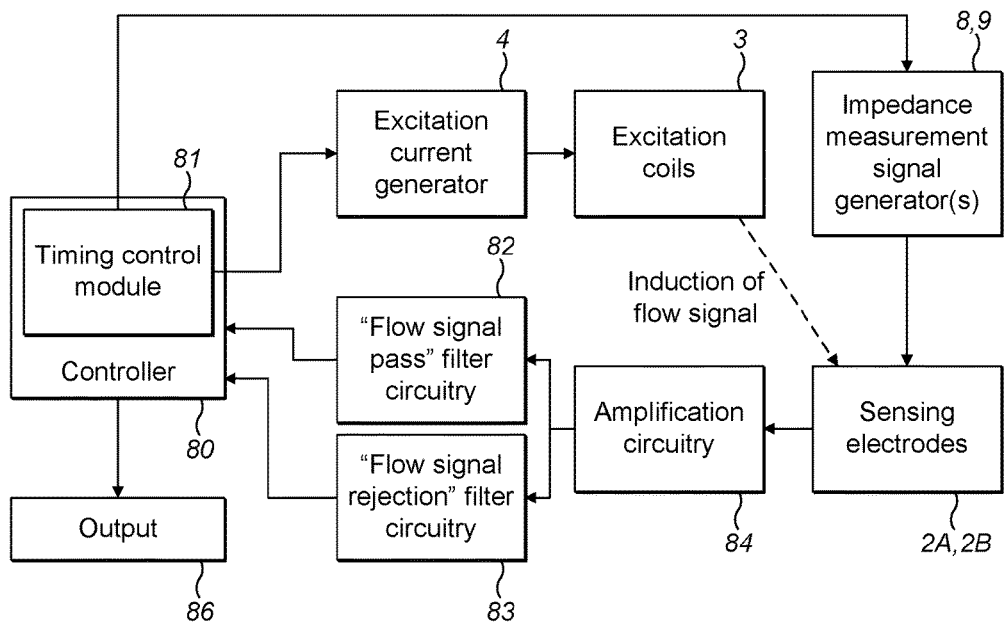
FIG. 10 is a schematic illustration of a flowmeter circuit including impedance measurement signal generators (e.g.

FIG. 10 is a schematic illustration of a flowmeter circuit including impedance measurement signal generator(s) 8 & 9 as described above, with "flow signal pass" filter circuitry 82 (e.g. configuration 10 described above) in parallel with "flow signal rejection" filter circuitry 83 (e.g. configurations 30 or 60 as described above).

The circuit is controlled by a controller 80, which is typically a suitably-programmed microprocessor (having associated memory, a power supply, etc., as those skilled in the art will appreciate).

The controller 80 is configured to control the excitation current generator 4, to cause the excitation current generator 4 to supply an alternating excitation current to the excitation coils 3 and thereby generate an alternating magnetic field (as described above with reference to FIG. 1). The controller 80 also controls the operation of the impedance measurement signal generator(s) 8, 9. To this end, the controller 80 is effectively provided with a timing control module 81 (which may be an integral part of the controller or a separate timer unit associated with the controller) to control the impedance measurement signal generator(s) 8, 9 in synchronism with the operation of the excitation current generator 4, so as to cause electrode impedance measurement pulses to be supplied to electrodes 2A and 2B at given times during the excitation cycle of the flow measurement coils 3.

Preferably, as described above, the generation of the electrode impedance measurement pulses is timed to coincide with the normally "wasted" portion of the excitation cycle, just after each polarity inversion of the excitation coil current in which flow measurement is not possible.

In use, movement of fluid through the alternating magnetic field produced by the flow measurement coils 3 generates a voltage between sensing electrodes 2A and 2B (as indicated by the broken arrow in FIG. 10 depicting the induction of the flow signal). This voltage forms the basis of the signal that is subsequently processed. The signal produced by sensing electrodes 2A and 2B also includes electrode impedance measurement signals arising from the application of the electrode impedance measurement pulses to the electrodes 2A and 2B.

The overall signal is amplified by amplification circuitry 84 (e.g. comprising differential amplifier 5 as described above) and the resulting composite signal (6 in FIG. 1) is then processed by the "flow signal pass" filter circuitry 82 in parallel with the "flow signal rejection" filter circuitry 83. Within the filter circuitry 82 and the filter circuitry 83, applicable delay values L, K and M (as depicted in FIGS. 2, 4 and 7) may be determined and set by the controller 80 as a function of the coil excitation frequency used (e.g. as per the formulae given above).

The output of the "flow signal pass" filter circuitry 82 is then processed by the controller 80 (e.g. employing synchronous demodulation) to provide an output representative of (or dependent on) the flow velocity of the fluid, whilst the output of the "flow signal rejection" filter circuitry 83 is processed by the controller 80 to provide an output representative of (or dependent on) electrical impedance in respect of one or both of the sensing electrodes 2A, 2B. These outputs are collectively represented by output 60 of FIG. 10.

Modifications and Alternatives

Detailed embodiments and some possible alternatives have been described above. As those skilled in the art will appreciate, a number of modifications and further alternatives can be made to the above embodiments whilst still benefiting from the inventions embodied therein.

For instance, there is considerable freedom of choice of the frequency (or pulse duration) of the electromagnetic excitation drive waveform and the electrical impedance measurement pulses.

Whilst the above embodiments use a square wave excitation signal to drive the flow measurement coils, in alternative embodiments other forms of excitation may be used, such as a non 50:50 pulse (e.g. a square wave with a mark to space ratio in which each pulse is "on" for a shorter period of time than it is "off", or vice-versa), a sine wave, a triangular wave, a saw-tooth wave, etc.

Whilst, with the above embodiments, the EM flowmeter is primarily described as being arranged to measure the fluid velocity (and optionally fluid level) within a pipe, in other applications the flowmeter may be coupled to other kinds of conduit along/through which fluid can flow.

Whilst, in the above embodiments, comb filters are used to implement a delay line to enable combination of the first and second measurement signals (obtained during the first and second time intervals respectively) and thence extraction of the electrode impedance measurement signal, in alternative embodiments other means for storing one or both of the first and second measurement signals and to enable their combination may be employed. For example, one or more digital signal processors may be used, operating in conjunction with suitable analogue-to-digital converters. However, comb filters, as described herein, are advantageous in being able to process signals within the analogue domain, which can reduce power consumption (compared to equivalent digital signal processing).

It is not necessary to restrict the type of comb filter to feed forward comb filters. Instead, alternative feedback comb filters, or continuous time comb filters, can be used.

Also, although not expressly illustrated or discussed above, it will be appreciated that the comb filter may apply a scaling factor to the delayed signal, before the delayed signal is combined with (e.g. subtracted from) the input signal.

Whilst, in the above embodiments, the electrode impedance measurement circuitry is incorporated within a electromagnetic flowmeter, in alternative embodiments it may be provided as sensing apparatus in the form of a separate unit or module for connection to a pre-existing electromagnetic flowmeter.

Summary

As discussed above, the present work provides, for an electromagnetic flowmeter, a method and apparatus for measuring the electrical impedance between voltage sensing electrodes 2A, 2B and ground (such as electrode 9). The method and apparatus allows simultaneous measurement of fluid flow velocity and the electrical impedance of each measurement electrode. A cancellation method enables the measurement of small amplitude electrical excitation impedance components from generators 7 & 8 in the presence of potentially larger electromagnetically induced flow velocity signals and unwanted inductance, transformer action and eddy current signals. The method also ensures the wanted flow velocity signal is not influenced or corrupted by these simultaneous electrical impedance measurements. The technique can be used for empty pipe detection and can readily be extended to enable the fluid level in a pipe (or other conduit) to be determined.

The invention claimed is:

1. A method of obtaining a measure of electrical impedance in respect of one or more sensing electrodes of an electromagnetic flowmeter, the method comprising:
   intermittently injecting an impedance measurement signal to at least one of the sensing electrodes whilst a coil excitation drive signal is applied to field generating coils of the flowmeter;
   during a first interval, when the coil excitation drive signal is applied to the coils and the impedance measurement signal is injected to at least one of the sensing electrodes, obtaining a first measurement signal from the sensing electrodes, the first measurement signal comprising an electromagnetically induced flow measurement signal and an electrode impedance measurement signal;
   during a second interval, when the coil excitation drive signal is applied to the coils but the impedance measurement signal is not injected to at least one of the sensing electrodes, obtaining a second measurement signal from the sensing electrodes, the second measurement signal comprising an electromagnetically induced flow measurement signal; and
   combining the first measurement signal and the second measurement signal to obtain an output signal comprising the electrode impedance measurement signal without the electromagnetically induced flow measurement signal;
   wherein the coil excitation drive signal has a cyclically varying wave form having a drive period;
   wherein the combining comprises using a delay line having a delay period;
   wherein the delay period is an integer number of cycles of the drive period of the coil excitation drive signal.

2. The method according to claim 1, wherein the coil excitation drive signal has a recurring waveform, and wherein the intermittent impedance measurement signal is not injected during every recurrence of the coil excitation drive signal.

3. The method according to claim 1, wherein the delay line is implemented by a comb filter, the comb filter having the delay period.

4. The method according to claim 1, wherein the coil excitation drive signal has a form selected from a group comprising:
   a square wave, a pulsed form, a non 50:50 pulsed form, a sine wave, a triangular wave, a saw-tooth wave.

5. The method according to claim 1, wherein the injection of the impedance measurement signal is synchronised with the coil excitation drive signal.

6. The method according to claim 5, wherein the impedance measurement signal is timed to occur within a period selected from a group comprising:
   only the first 75% of a half-cycle of the coil excitation drive signal;

only the first 50% of a half-cycle of the coil excitation drive signal;

only the first 25% of a half-cycle of the coil excitation drive signal.

7. The method according to claim 5, wherein the impedance measurement signal comprises pulses of short duration, timed to occur just after polarity inversion of the coil excitation drive signal.

8. The method according to claim 1, wherein, for a pair of sensing electrodes, impedance measurement signals are injected in a staggered manner, such that one electrode of the pair receives an impedance measurement signal after the other electrode of the pair.

9. The method according to claim 1, wherein the first interval and the second interval are adjacent in time.

10. The method according to claim 1, wherein the first interval and the second interval are spaced apart in time.

11. The method according to claim 1, further comprising demodulating the electrode impedance measurement signal of the output signal to obtain a measure of electrical impedance in respect of at least one of the sensing electrodes.

12. The method according to claim 11, further comprising comparing the measure of electrode impedance to at least one threshold, and signalling at least one suspected fault condition in dependence on the results of the comparison.

13. The method according to claim 11, where measures of electrode impedance are obtained in respect of a plurality of sensing electrodes located around a cross-section of a conduit, at positions between a low point of the cross-section and a high point of the cross-section, in order to determine the filling level of the conduit from the electrode impedance of each of the sensing electrodes.

14. The method according to claim 1, further comprising, in parallel with the combining of the first measurement signal and the second measurement signal to obtain the output signal comprising the electrode impedance measurement signal without the electromagnetically induced flow measurement signal:

processing the first and/or second measurement signals to obtain a second output signal comprising the electromagnetically induced flow measurement signal without the electrode impedance measurement signal.

15. The method according to claim 14, wherein processing the first measurement signal comprises subjecting the first measurement signal to a comb filter operation.

16. The method according to claim 15, wherein the cyclically varying waveform of the coil excitation drive signal has symmetrically-alternating half cycles; and wherein said comb filter operation uses a delay period corresponding to the half cycle period of the coil excitation drive signal.

17. The method according to claim 1, wherein the impedance measurement signal is injected to at least one of the sensing electrodes in a manner selected from a group comprising:

constant current, constant voltage from a resistive source, voltage injection from a capacitive source.

18. A sensing apparatus for obtaining a measure of electrical impedance in respect of one or more sensing electrodes of an electromagnetic flowmeter, the sensing apparatus comprising:

one or more signal generators configured to intermittently inject an impedance measurement signal to at least one of the sensing electrodes whilst a coil excitation drive signal is applied to field generating coils of the flowmeter;

circuitry for obtaining a first measurement signal from the sensing electrodes during a first interval when the coil excitation drive signal is applied to the coils and the impedance measurement signal is injected to at least one of the sensing electrodes, the first measurement signal comprising an electromagnetically induced flow measurement signal and an electrode impedance measurement signal;

circuitry for obtaining a second measurement signal from the sensing electrodes during a second interval when the coil excitation drive signal is applied to the coils but the impedance measurement signal is not injected to at least one of the sensing electrodes, the second measurement signal comprising an electromagnetically induced flow measurement signal; and circuitry for combining the first measurement signal and the second measurement signal to obtain an output signal comprising the electrode impedance measurement signal without the electromagnetically induced flow measurement signal;

wherein the coil excitation drive signal has a cyclically varying wave form having a drive period;

wherein the circuitry for combining comprises a delay line having a delay period;

wherein the delay period is an integer number of cycles of the drive period of the coil excitation drive signal.

19. The sensing apparatus according to claim 18, wherein the or each signal generator is configured such that the intermittent impedance measurement signal is not injected during every recurrence of the coil excitation drive signal, the coil excitation drive signal having a recurring waveform.

20. The sensing apparatus according to claim 18, wherein the circuitry for combining further comprises a comb filter to provide the delay line, the comb filter having the delay period.

21. The sensing apparatus according to claim 18, further comprising a timer for synchronising the injection of the impedance measurement signal with the coil excitation drive signal.

22. The sensing apparatus according to claim 21, configured such that the impedance measurement signal comprises pulses of short duration, timed to occur just after polarity inversion of the coil excitation drive signal.

23. The sensing apparatus according to claim 21, configured such that the impedance measurement signal is timed to occur within a period selected from a group comprising:

only the first 75% of a half-cycle of the coil excitation drive signal;

only the first 50% of a half-cycle of the coil excitation drive signal;

only the first 25% of a half-cycle of the coil excitation drive signal.

24. The sensing apparatus according to claim 18, configured such that, for a pair of sensing electrodes, impedance measurement signals are injected in a staggered manner, such that one electrode of the pair receives an impedance measurement signal after the other electrode of the pair.

25. The sensing apparatus according to claim 18, configured such that the first interval and the second interval are adjacent in time.

26. The sensing apparatus according to claim 18, further comprising a demodulator for demodulating the electrode impedance measurement signal of the output signal to obtain a measure of electrical impedance in respect of at least one of the sensing electrodes.

27. The sensing apparatus according to claim 26, further comprising circuitry for comparing the measure of electrode impedance to at least one threshold, and signalling at least one suspected fault condition in dependence on the results of the comparison.

28. The sensing apparatus according to claim 26, wherein a plurality of sensing electrodes are located around a cross-section of a conduit, at positions between a low point of the cross-section and a high point of the cross-section, to enable the filling level of the conduit to be determined from the electrode impedance of each of the sensing electrodes.

29. The sensing apparatus according to claim 18, further comprising, in parallel with the circuitry for combining, circuitry for processing the first and/or second measurement signals to obtain a second output signal comprising the electromagnetically induced flow measurement signal without the electrode impedance measurement signal.

30. The sensing apparatus according to claim 29, wherein the circuitry for processing comprises a comb filter.

31. The sensing apparatus according to claim 30,
wherein the cyclically varying waveform of the coil excitation drive signal has symmetrically-alternating half cycles; and
wherein said comb filter uses a delay period corresponding to the half cycle period of the coil excitation drive signal.

32. The sensing apparatus according to claim 18 being an electromagnetic flowmeter, the electromagnetic flowmeter comprising said field generating coils, an excitation current generator for supplying said field generating coils with said coil excitation drive signal, and said sensing electrodes.

* * * * *